United States Patent [19]
Jang et al.

[11] Patent Number: 5,863,807
[45] Date of Patent: *Jan. 26, 1999

[54] MANUFACTURING METHOD OF A SEMICONDUCTOR INTEGRATED CIRCUIT

[75] Inventors: Young-Chul Jang, Suwon; Bo-Yeon Shim, Ahnsan; Chung-Sam Ahn, Seongnam, all of Rep. of Korea

[73] Assignee: Samsung Electronics Co., Ltd., Suwon, Rep. of Korea

[ * ] Notice: This patent issued on a continued prosecution application filed under 37 CFR 1.53(d), and is subject to the twenty year patent term provisions of 35 U.S.C. 154(a)(2).

[21] Appl. No.: 616,896

[22] Filed: Mar. 15, 1996

[30] Foreign Application Priority Data

Sep. 20, 1995 [KR] Rep. of Korea .................. 30940/1995

[51] Int. Cl.$^6$ ..................................................... H01L 21/66
[52] U.S. Cl. ................................ 438/14; 438/18; 382/145
[58] Field of Search .................................. 438/14, 15, 16, 438/17; 382/145; 257/48

[56] References Cited

U.S. PATENT DOCUMENTS

| | | | |
|---|---|---|---|
| 5,665,609 | 9/1997 | Mori | 438/16 |
| 5,691,648 | 11/1997 | Cheng | 438/17 |
| 5,780,317 | 7/1998 | Jun et al. | 438/16 |
| 5,787,190 | 7/1998 | Peng et al. | 438/17 |

*Primary Examiner*—Tuan H. Nguyen
*Attorney, Agent, or Firm*—Myers Bigel Sibley & Sajovec

[57] ABSTRACT

A method of manufacturing a semiconductor device having a plurality of measuring steps performed by a plurality of measuring equipment comprising the steps of; (a) determining the operational state of each one of the plurality of measuring equipment, (b) selecting and performing a measuring step from the plurality of measuring steps in accordance with the determination made in step (a), and repeating steps (a) and (b) until the plurality of measuring steps is completed.

6 Claims, 2 Drawing Sheets

MANUFACTURING METHOD OF A SEMICONDUCTOR INTEGRATED CIRCUIT

BACKGROUND OF THE INVENTION

The present invention relates to a manufacturing method for semiconductor devices. More particularly, the present invention relates to a manufacturing method for semiconductor integrated circuits having improved yield and utilizing a flexible process sequence.

In the following background discussion, problems with conventional semiconductor manufacturing methods are described with reference to an oxidation process. The oxidation process is basic to semiconductor manufacturing methods. Generally, the oxidation process is one wherein the surface of a wafer is exposed to an oxidizing atmosphere at high temperature to thereby form an oxide film having uniform thickness and stable physical properties.

Of central concern to all semiconductor manufacturing methods is the question of yield. Again, using the example of an oxidation process, yield is typically measured by a comparison between the number of wafers which successfully finish the oxidation process, and the number of wafers which begin the oxidation process. Physical parameters such as oxide film thickness and resistance must be measured and controlled during the course of the oxidation process to improve yield. Proper electrical operation of the ultimately formed semiconductor device depends on the oxide layer satisfying the particular physical parameters set forth in a production specification. Accordingly, much attention is paid to improving the yield by minimizing changes to a successful manufacturing process. Yet, flexibility in the manufacturing processes is also highly desirable.

FIG. 1 is a flow chart illustrating a conventional method of forming and measuring an oxide film on a wafer. Referring to FIG. 1, the conventional manufacturing method comprises the steps of; placing the wafer in a quartz crystal holder, or "boat," in a reaction source cabinet (step 10), forming an oxide film having a constant thickness on the wafer by reacting the wafer with oxygen (step 11), measuring the thickness of the oxide film (step 12), measuring the contamination particles in the wafer (step 13), measuring sheet resistance of the wafer (step 14), eliminating the contamination particles, or cleaning the wafer with a solution of sulfuric acid (step 15), and removing the wafer from the boat (step 16).

Thus, in the conventional manufacturing method, the measuring steps are sequentially performed in a fixed order. In other words, the steps of thickness measuring 12, the contamination particle measuring 13, and resistance sheet measuring 14 are performed in sequence. Accordingly, even though equipment for measuring contamination particles and equipment for measuring sheet resistance can operate independently, they are, nonetheless, used only after the oxide film thickness has been measured. Such sequential operation results in delay during the manufacturing process and utilizing equipment inefficiently.

SUMMARY OF THE INVENTION

The present invention provides a semiconductor manufacturing method having improved yield. The present invention also provides a semiconductor manufacturing method which allows flexibility in the sequence of required measuring steps. Thus, the present invention increases the efficiency with which semiconductor measuring equipment is used, and reduces the overall time required to manufacture semiconductor devices.

The present invention provides the foregoing in a method including a plurality of measuring steps performed by a plurality of measuring equipment, and comprising the steps of; (a) determining the operational state of each one of the plurality of measuring equipment, (b) selecting and performing a measuring step from the plurality of measuring steps in accordance with the determination made in step (a), and (c) repeating step (b) until the plurality of measuring steps is complete.

In another aspect, the present invention provides a method of manufacturing a semiconductor device, the method including a plurality of measuring steps, wherein each measuring step is independently performed by a corresponding pieces of measuring equipment, the method comprising the steps of; (a) determining the operational state of the corresponding pieces of measuring equipment, (b) selecting and performing a measuring step from the plurality of measuring steps in accordance with the determination made in step (a), and (c) repeating steps (a) and (b) until the plurality of measuring steps is complete.

BRIEF DESCRIPTION OF THE DRAWINGS

The following is a detailed description of this invention by the reference of the attached drawings, in which like numbers indicate the same or similar elements.

DETAILED DESCRIPTION OF THE PREFERRED EMBODIMENT

Figure 1:
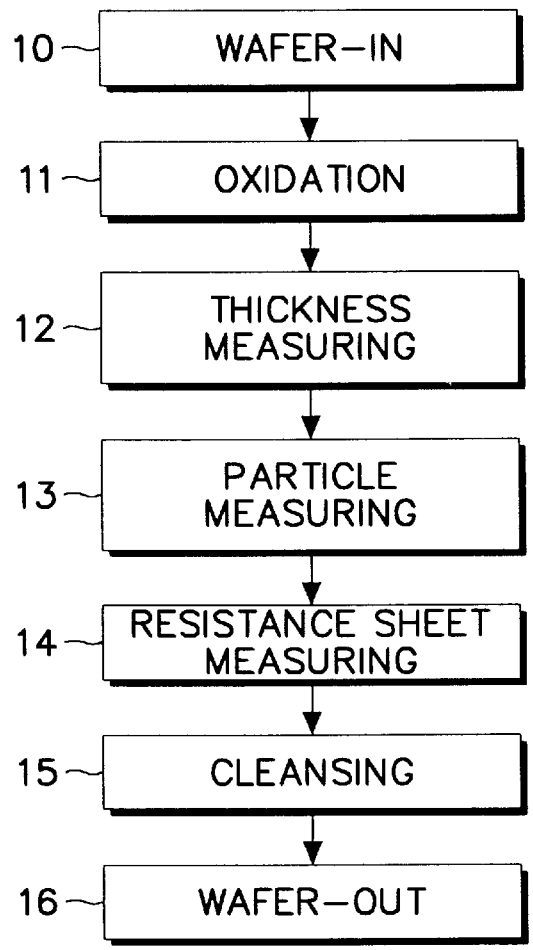
FIG. 1 is a flow chart illustrating a conventional semiconductor manufacturing method.
Figure 2:
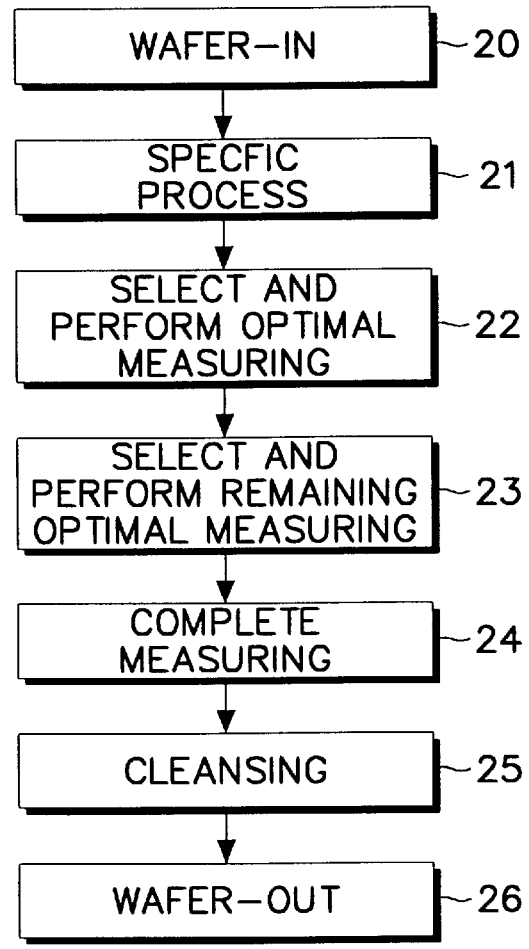
FIG. 2 is a flow chart illustrating a semiconductor manufacturing method according to an embodiment of the present invention.

The semiconductor manufacturing method according to the present invention, as illustrated by FIG. 2, comprises the steps of; placing the wafer in a boat in a reaction source cabinet (step 20), performing a specific process step among the plurality of manufacturing process steps required to manufacture a semiconductor device (step 21), selecting and performing an optimal measuring step from among a plurality of measuring steps required by the foregoing specific process (step 22), selecting and performing another, remaining measuring step (step 23), completing the measuring steps (step 24), cleansing the wafer (step 25), and removing the wafer from the boat (step 26).

Figure 3:
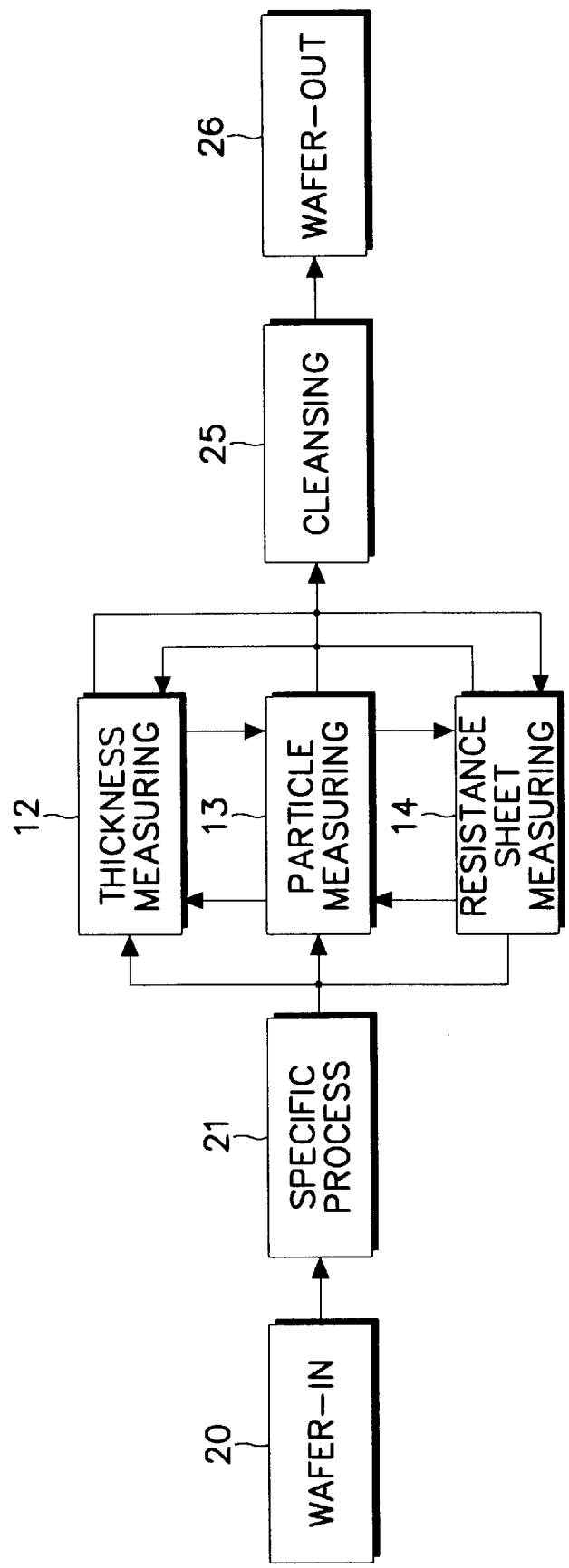
FIG. 3 is a flow chart illustrating a semiconductor manufacturing method according to another embodiment of the present invention.

Referencing FIG. 3 and the exemplary oxidation process above, one measuring step from the plurality of measuring steps 12, 13 and 14 may be flexibly performed, then the next measuring step selected and performed, and finally the last measuring step may be performed. Here, flexible control of the semiconductor manufacturing method can be realized by a controller provided, for example, by a microcomputer. This kind of controller is programmed to control the flexible manufacturing processes, and is connected to respective measuring equipments through sensors to thereby check on the status of each equipment, and proceed with the measuring steps in an efficient manner. Furthermore, the controller generates a command which drives the respective measuring equipment. Also, the controller has a plurality of internal storage registers for flexibly, rather than sequentially, performing the required measuring steps. Finally, the controller can control the measuring steps by checking the various storage registers at the time it actually generates the drive command signal.

In this manner, the measuring procedures for a specific manufacturing process are flexibly performed, thereby efficiently utilizing the semiconductor measuring equipment and shortening the overall manufacturing cycle. The foregoing embodiments have been given by way of example. In particular, the oxidation process is exemplary of any semiconductor process susceptible to the present invention requiring multiple measuring steps. It will be understood by those skilled in the art that various changes and modifications may be made, and equivalents may be substituted for elements described above without departing from the scope of the present invention as defined by the appended claims.

What is claimed is:

1. A method of performing a plurality of measurements on a semiconductor device, the method comprising the steps of:

determining an operational state for each of a plurality of measuring equipment that is used to perform the plurality of measurements;

identifying an optimal sequence of the plurality of measurements to be performed using the plurality of measuring equipment based on the determined operational state for each of the plurality of measuring equipment; and performing the plurality of measurements using the plurality of measuring equipment in the determined optimal sequence of measurements based on the determined operational state for each of the plurality of measuring equipment.

2. A method according to claim 1:

wherein said step of determining an operational state comprises the step of obtaining a first determination of an operational state for a first plurality of measuring equipment;

wherein said step of identifying an optimal sequence comprises the step of identifying a first measurement of the sequence of measurements based on the first determination;

wherein said step of performing comprises the step of performing the identified first measurement;

wherein said step of determining an operational state further comprises the step of obtaining a second determination of an operational state for a second plurality of measuring equipment;

wherein said step of identifying an optimal sequence further comprises the step of identifying a second measurement of the sequence of measurements based on the second determination; and wherein said step of performing further comprises the step of performing the identified second measurement.

3. A method according to claim 1, wherein said step of determining an operational state is preceded by the step of defining a set of operational parameters based on operational characteristics of the plurality of measuring equipment and temporal characteristics of measurements performed thereby, and wherein said step of identifying a sequence of measurements comprises the step of identifying a sequence of measurements based on the defined set of operational parameters.

4. A method of performing a plurality of measurements on a semiconductor device, the method comprising the steps of:

determining an operational state for a first equipment for measuring oxide film thickness, for a second equipment for measuring contaminant particles, and for a third equipment for measuring sheet resistance;

identifying an optimal sequence of oxide film thickness, contaminant particle and sheet resistance measurements to be performed by the first, second and third equipment, respectively, based on the determined operational states of the first, second and third equipment; and performing the identified optimal sequence of oxide film thickness, contaminant particle and sheet resistance measurements based on the determined operational states of the first, second and third equipment.

5. A method according to claim 4:

wherein said step of determining an operational state comprises the step of obtaining a first determination of an operational state for a first plurality of the first, second and third measuring equipment;

wherein said step of identifying an optimal sequence further comprises the step of identifying a first one of an oxide film thickness, contaminant particle and sheet resistance measurement to be performed based on the first determination;

wherein said step of performing comprises the step of performing the identified first measurement;

wherein said step determining an operational state further comprises the step of obtaining a second determination of an operation state for a second plurality of the first, second and third measuring equipment;

wherein said step of identifying an optimal sequence further comprises the step of identifying a second one of the oxide film thickness, contaminant particle and sheet resistance measurements based on the second determination; and wherein said step of performing further comprises the step of performing the identified second measurement.

6. A method according to claim 4, wherein said step of determining an operational state is preceded by the step of defining a set of operational parameters based on operational characteristics of the first, second and third measuring equipment and respective temporal characteristics of measurements performed thereby, and wherein said step of identifying an optimal sequence comprises the step of identifying an optimal sequence of measurements based on the defined set of operational parameters.

* * * * *